(12) United States Patent
Mangersnes et al.

(10) Patent No.: US 9,425,333 B2
(45) Date of Patent: Aug. 23, 2016

(54) METHOD FOR PRODUCING A SOLAR CELL

(75) Inventors: Krister Mangersnes, Stavanger (NO);
Sean Erik Foss, Skedsmokorset (NO)

(73) Assignee: Institutt for Energiteknikk, Kjeller (NO)

( * ) Notice: Subject to any disclaimer, the term of this patent is extended or adjusted under 35 U.S.C. 154(b) by 506 days.

(21) Appl. No.: 13/882,051

(22) PCT Filed: Oct. 25, 2011

(86) PCT No.: PCT/EP2011/068665
§ 371 (c)(1),
(2), (4) Date: Jul. 19, 2013

(87) PCT Pub. No.: WO2012/055871
PCT Pub. Date: May 3, 2012

(65) Prior Publication Data
US 2013/0291937 A1    Nov. 7, 2013

Related U.S. Application Data

(60) Provisional application No. 61/407,171, filed on Oct. 27, 2010.

(30) Foreign Application Priority Data

Oct. 27, 2010    (NO) .................................. 20101511

(51) Int. Cl.
H01L 31/0224    (2006.01)
C23C 14/04    (2006.01)

(52) U.S. Cl.
CPC ...... *H01L 31/022425* (2013.01); *C23C 14/046* (2013.01); *H01L 31/022441* (2013.01); *Y02E 10/50* (2013.01)

(58) Field of Classification Search
CPC ............... H01L 31/022425; H01L 31/022441; C23C 14/046; Y02E 10/50
See application file for complete search history.

(56) References Cited

U.S. PATENT DOCUMENTS 5,053,083 A    10/1991    Sinton
5,449,626 A    9/1995    Hezel
(Continued)

FOREIGN PATENT DOCUMENTS

DE    10 2004 053 873 A1    5/2006

OTHER PUBLICATIONS

Search Report issued May 27, 2011 in Norwegian Application No. 20101511 (With English Translation of Category).
(Continued)

*Primary Examiner* — Michelle Mandala
(74) *Attorney, Agent, or Firm* — Christopher & Weisberg, P.A.

(57)    ABSTRACT

A device including a surface layer of a selected material in a predetermined pattern on a substrate surface. A groove or ridge arranged in the substrate surface includes a bottom or top face, respectively, and at least one side face sloping relative to the bottom or top face. The surface layer is deposited on a part of the substrate including the groove or ridge by vacuum chamber sputtering the selected material from a sputtering source while moving the substrate past the sputtering source in a direction substantially perpendicular to a sputtering main lobe direction and with a normal to the substrate surface substantially in a predefined angle with the main lobe direction. By uniformly etching away surface layer material deposited on the substrate by the sputtering until freeing a substantial part of the side face, the predetermined pattern becomes defined substantially by the bottom face or the top face.

11 Claims, 6 Drawing Sheets

(56) References Cited

U.S. PATENT DOCUMENTS

| | | | |
|---|---|---|---|
| 6,162,658 A | 12/2000 | Green et al. | |
| 2004/0168908 A1* | 9/2004 | Friedemann | C23C 14/34 204/192.17 |
| 2006/0073700 A1* | 4/2006 | Brown | C23C 14/046 438/643 |
| 2007/0249085 A1 | 10/2007 | Ojima et al. | |
| 2008/0254619 A1* | 10/2008 | Lin | H01L 21/02063 438/675 |

OTHER PUBLICATIONS

International Search Report Issued Oct. 2, 2012 in PCT/EP11/68665 Filed Oct. 25, 2011.

* cited by examiner

METHOD FOR PRODUCING A SOLAR CELL

The present invention relates generally to the field of surface structures of predefined patterns. More particularly, the invention relates to a method for producing a surface structure pattern with high accuracy at a microscopic level, such as a pattern of conductors on the surface of a silicon wafer or chip, that is particularly well suited for production of efficient solar cell panels or photovoltaic cells at a relatively low cost, and the product produced by such a method, as well as an apparatus comprising the means for implementation of the method.

BACKGROUND

A solar cell is a device that converts solar energy directly into electricity by the photovoltaic effect. In silicon solar cells, the material absorbs solar irradiation by generation of charge carriers that are transported out of the cell and into an external electrical circuit. In order to force the charge carriers out of the cell, a p-n diode needs to be built in to the device. This is usually done by diffusion of boron and phosphorus into the silicon wafer. The current extraction is done at metal to semiconductor interface areas, where the silicon is connected to the external circuit. The contacts to the different polarity regions need to be physically separated in order to prevent electrical shunting. Back-contact back-junction (BC-BJ) silicon solar cells comprise silicon solar cells where the complete metallization and the diffused regions are located on the backside of the cell. This solar cell concept has shown high energy conversion efficiencies because of the eliminated front surface shading compared to conventional front contacted silicon solar cells. The production of BC-BJ silicon solar cells is, however, more challenging, more expensive, and less mature than that of conventional silicon solar cells. The challenges are mostly related to the alignment and structuring of the closely spaced diffused regions on the back of the cell. Originally this type of cell design was processed with the use of 4-6 photolithography masking steps, which is regarded incompatible with large-scale production of cost competitive solar cells. More recently, BC-BJ silicon solar cell concepts that are based on lower cost processing techniques have been developed, but still there is a need to further reduce the cost of solar cell production to make it a cost competitive source of electricity.

SUMMARY OF THE INVENTION

The invention provides a method for producing a surface layer of a selected material in a predetermined pattern on a surface of a substrate having a multi level surface structure constituted by at least one of a ridge and a recess, and sloping surface part located adjacently to a top face of said ridge and a bottom face of said recess, and the substrate having a groove arranged in said substrate surface, said groove having a bottom face and at least one side face sloping by less than 180 degrees or more preferably by less than 165 degrees, or even more preferably by less than 150 degrees with respect to the substrate top face,
depositing said surface layer on a part of said substrate comprising said groove by vacuum chamber sputtering of said selected material from a sputtering source while moving said substrate in a predefined pattern past said sputtering source in a direction substantially perpendicular to a direction of a main lobe of sputtering from said sputtering source and with a normal to the surface of the substrate substantially in parallel with said main lobe direction, or with a normal to the surface of the substrate substantially in a predefined angle with respect to said main lobe direction sufficient to generate a thicker, more preferably at least $1 \times 10^{-6}$ meter thicker, deposited metal layer on the said bottom face of groove or recess and on said ridge than on the said side faces, and
uniformly etching away surface layer material deposited on said substrate by said sputtering until at least a substantial part of said side face is free of said surface layer, whereby the predetermined pattern becomes defined substantially by the bottom face of the groove.

Further advantageous features of the method of the invention are recited in the accompanying patent claims 2, 9-13 and 16-21.

The invention provides
a micro electronic device including a substrate having on a bottom face of a groove arranged in a surface thereof a surface layer of a selected material deposited by vacuum chamber sputtering, said groove having at least one side face sloping by less than 180 degrees or more preferably by less than 165 degrees, or even more preferably by less than 150 degrees with respect to the substrate top face, and where
the surface layer of the selected material on the bottom face of the groove extends crosswise with respect to said groove in continuity past said bottom face, to taper off on a portion of the at least one side face that is located adjacently to said bottom face.

Further advantageous features of the device of the invention are recited in the accompanying patent claims 3-6, 9-12, 14, 16-17 and 19-21.

The invention provides an apparatus for preparing a structured surface layer of a selected material by vacuum chamber sputtering deposition on a micro electronic device substrate having on a bottom face a groove arranged in said surface thereof, said groove having at least one side face sloping by less than 180 degrees or more preferably by less than 165 degrees, or even more preferably by less than 150 degrees with respect to the substrate top face, and a vacuum chamber sputtering device adapted to deposit said surface layer on a part of said substrate comprising said groove by vacuum chamber sputtering of said selected material from a sputtering source,
a conveyor means adapted to position said substrate with a normal to the substrate surface substantially in parallel with a direction of a main lobe of sputtering from said sputtering source, and to move said substrate in a predefined pattern past said sputtering source in a direction substantially perpendicular to said main lobe direction during sputtering, and a material etching means adapted to uniformly etch away surface layer material deposited on said substrate by said sputtering until at least a substantial part of said side face is free of said surface layer.

Further advantageous features of the apparatus of the invention are recited in the accompanying patent claims 7-12 and 15-21.

The invention provides a computer program on a carrier, the features of the computer program being recited in the accompanying patent claim 22.

Further advantageous features of the computer program of the invention are recited in the accompanying patent claims 23.

DETAILED DESCRIPTION OF THE INVENTION

In the following, the invention will be elucidated by referring to examples or experiments carried out by the inventors, and observations made during experiments, their results, and calculations made in respect of the experiments, and with reference to the illustrations provided in the accompanying figures, wherein.

Figure 1:
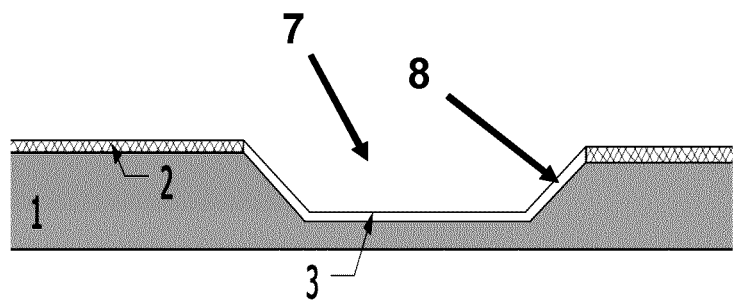
FIG. 1 is a schematic cross section view drawing illustration of a substrate having a groove.
Figure 9:
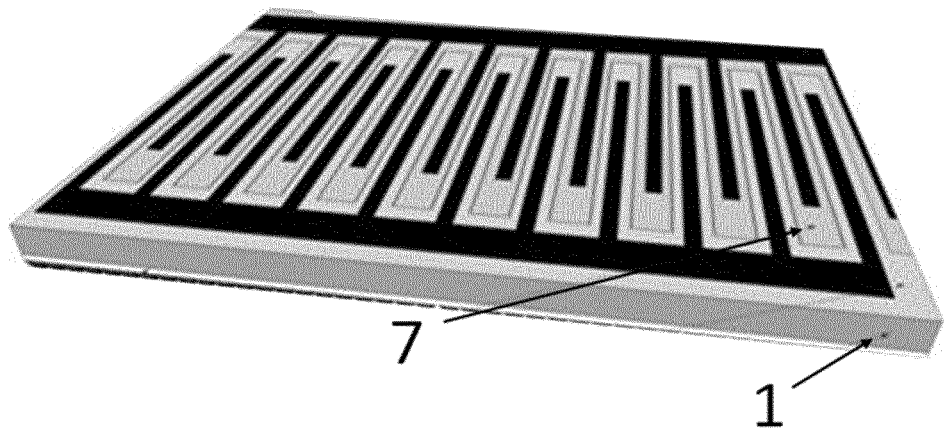
FIG. 9 is a 3 dimensional drawing illustration of one embodiment of a finger pattern in a substrate.

The invention relates to a self-aligned metallization technique particularly well suited for electrically contacting of back-contacted silicon solar cells. Prior to the metallization of a silicon wafer or chip, the backside of the silicon wafer or chip has been structured, typically in a parallel finger pattern, as illustrated in one example of embodiment in FIG. 9, with interdigitated regions of alternating p- and n-doping. With reference to cross section view of FIG. 1, and other figures showing the same reference numerals, a first polarity doping of a processed semiconductor wafer or chip 1 is at the "elevated" level 2, typically corresponding to the original surface level of the substrate, of the original backside of the wafer or chip, while the second polarity doping, different from the first polarity doping, is at a lowered level 3 of a groove or recess 7, and on a substantial part of the flanks 8 of that groove or recess. The surface of the substrate is substantially flat, and with a structure represented by ridges and/or grooves. The orientation of the surface of the substrate is typically the same as that of said "elevated" level 2. Establishing the levels can be done by a well known chemical, laser based or mechanical processing of the wafer or chip. It should be noted that, there is no exact indication provided in the accompanying drawing figures of the proper location of a transition between regions of different doping.

Figure 10:
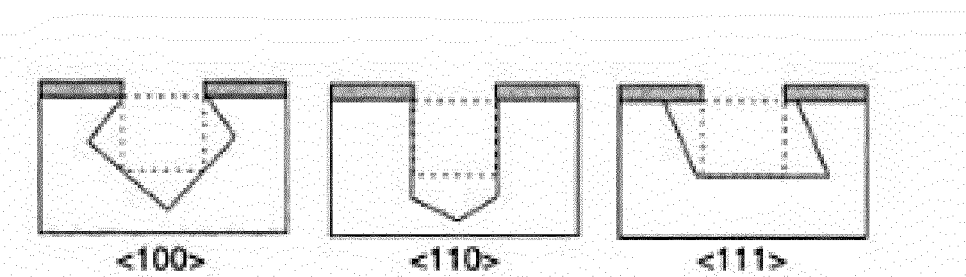
FIG. 10 is a schematic cross section view drawing illustration showing possible shapes of etched groove.

Different groove shapes are achievable by different processing methods, and some possible shapes are shown in FIG. 10, and as explained in "Introduction to microfabrication", Sami Franssila, ISBN 0-470-85105-8, fig. 21.22.

It shall also be noted that during processing and handling of the wafer or chip 1 in atmospheric room conditions, or in environmental conditions not specifically designed to prevent oxidation, an oxide layer (not shown) will very fast establish itself at the surface 2, 3 of the wafer or chip. This oxide layer will be acting as an isolating layer, and prevent any leakage current or shunting if the sputter deposited layer 6 overlap from p-type of doped layer to n-type of doped layer or opposite.

Figure 2:
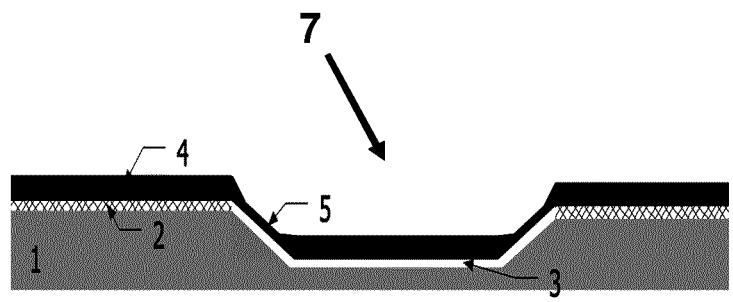
FIG. 2 is a schematic cross section view drawing illustration of the substrate having a groove illustrated in FIG. 1 and a surface layer material deposited thereon according to an embodiment of the invention.

With reference to FIG. 2, an electrically conducting metal layer 4 is deposited by sputtering at the surface, which surface in the case of a BC-BJ silicon solar cell is a backside surface of the wafer or chip 1. The electrically conductive material may include one of aluminium, chromium, copper, gold, iron, lead, molybdenum, nickel, silver, tantalum, tin, titanium, palladium, platinum, and vanadium.

Figure 3:
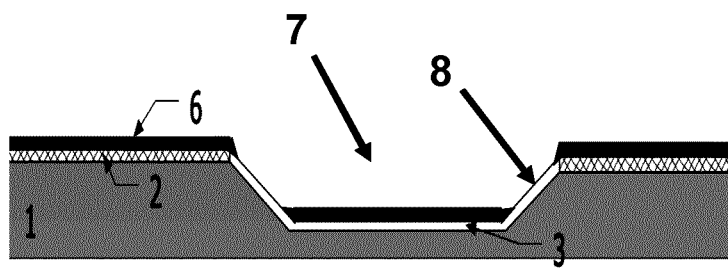
FIG. 3 is a schematic cross section view drawing illustration of a substrate having a groove and a surface layer material deposited thereon illustrated in FIG. 2, having a pattern defined by material remaining on the bottom face of the groove according to an embodiment of the invention.

During deposition by sputtering, the structured backside of the silicon wafer or chip 1 having the grooves or recesses 7 is positioned in the vacuum chamber sputtering apparatus such that it faces one or several sources, frequently called "targets", of metal, and during sputtering the wafer carrier is moved substantially parallel to the target(s). The inventors have discovered that the sputtering will be at an oblique angle to the wafer or chip surface most of the time, probably due to the wide sputter lobe of sputter from the source ("target"), giving rise to a flank layer of material 5 deposited by sputter on the flanks 8 that has less thickness than that of the surface layer 4 of material deposited by sputter on at the elevated doped regions 2 and the lowered doped regions 3. The inventors considers this to be a result of geometrical effects that are dependent on the depth of the groove or recess, the angle of the flank surface 8 with respect to the surfaces of the elevated regions 2 and the lowered regions 3, and the angle of the target relative to the substrate. Typically, as a wafer carrier holding the wafer or chip moves the wafer or chip past the sputter source ("target") within the sputter apparatus during sputter deposition, the angles of the various surfaces of the wafer or chip with respect to the sputter source ("target") and the lobe of sputter emitted from the "target", will vary. With reference to FIG. 3, subsequent to sputter deposition, the layer 4,5 deposited by sputtering on the surfaces of the wafer or chip is subjected to uniformly acting etching, which could be achieved by a chemical etch, that reduces the thickness of the metal layer deposit until no substantial metal deposit remains on the flanks, while substantial surface layers 6 remain on the elevated doped regions 2 and the lowered doped regions 3, respectively, to form electrical connections to conductive areas in those regions 2,3. In this regard, "no substantial metal deposit" refers to the deposit being removed to the extent that the deposits 5 on the flanks 8 are removed to the extent that there is no electrical connection formed by that which before etching was deposit 5 between the elevated doped regions 2 and the lowered doped regions 3.

In the foregoing, the invention has been explained by way of example wherein the substrate of the wafer or chip is provided with a groove or recess forming the lowered doped region 3. However, the invention is equally applicable for a substrate of the wafer or chip that is provided with a ridge 5 forming the elevated doped region 2.

Figure 4:
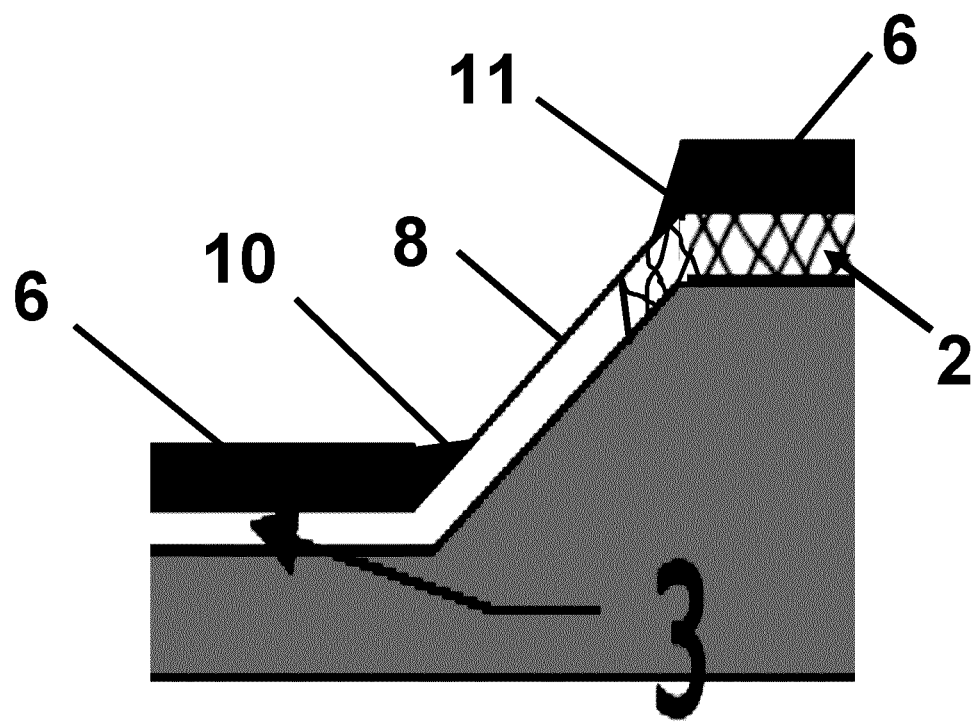
FIG. 4 is a schematic cross section view drawing detail illustration of the substrate illustrated in FIG. 3, showing detailed features of deposited material remaining on the bottom face of the groove and top face of the ridge according to an embodiment of the invention.
Figure 12:
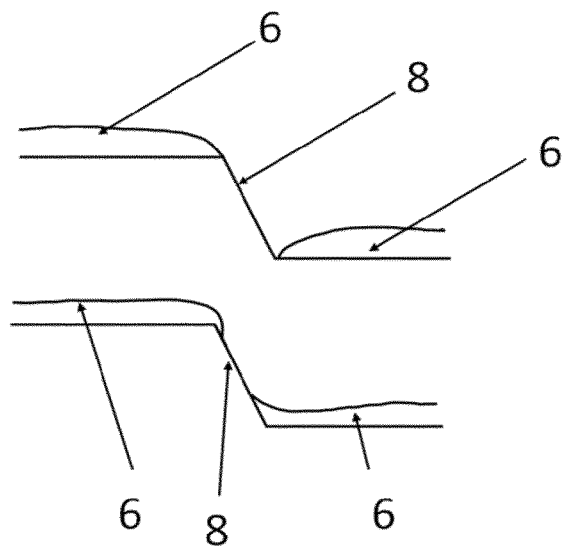
FIG. 12 is a schematic cross section view drawing illustrating different shapes of which the deposited metal layer might taper off towards the adjacent side face after etching.

With reference to FIGS. 4 and 12, by comparing a wafer or chip device provided with the self aligned pattern contact forming layers 6 on the elevated regions 2 and the lowered regions 3 obtained by the method described above, with similar contact forming layers made by other methods on same type of wafer or chip, the inventors have observed that in edge area 10 of the flank 8 that is located adjacently to the lowered region 3, the layers 6 typically exhibit a characteristic rounded shape, wherein the remaining material deposit on the face of the lowered region depending on the etching process either extends crosswise with respect to the groove or recess 7, in continuity past face of lowered region, to taper off on a portion of a face of the flank 8 that is located adjacently to that face of lowered region 3, or taper off on the lowered region 3 itself before it reaches the face of the said flank 8 as indicated in FIG. 12. Correspondingly, for a wafer or chip of a substrate provided with a ridge, as explained above, in edge area 11 of the flank 8 that is located adjacently to the elevated region 2 representing a top face of the ridge, the deposit layer 6 on the top face of the ridge depending on the etching process either extends to some extent crosswise with respect to said ridge in continuity past said top face, to taper off on a portion of a face of the flank 8 that is located adjacently to or bordering to the top face of the ridge, or it taper off on the top face itself towards the edge area 11 before it reaches the face of said flank 8 as indicated in FIG. 12.

Figure 5:
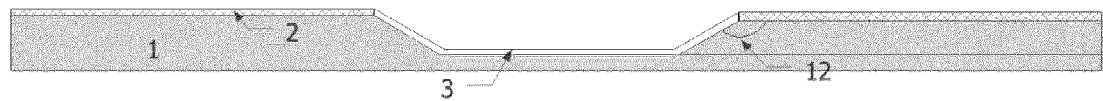
FIG. 5 is a schematic cross section view drawing illustration of the substrate of FIG. 1 where the angle of the side face or flank of the groove is defined.

With reference to the cross section view of FIG. 5, the angle 12 between the "elevated" level 2 and the flanks 8 of the groove or recess 7 is defined. Although some specific values for this angle for well working embodiments are defined in the claims, other angles may be used in a method or device according to the invention. In one embodiment of the invention the groove is etched using a chemical alkaline etch which results in a crystal structure of the silicon of 54.7 degrees, which result in an angle 12 of 125.3 degrees.

Figure 6:
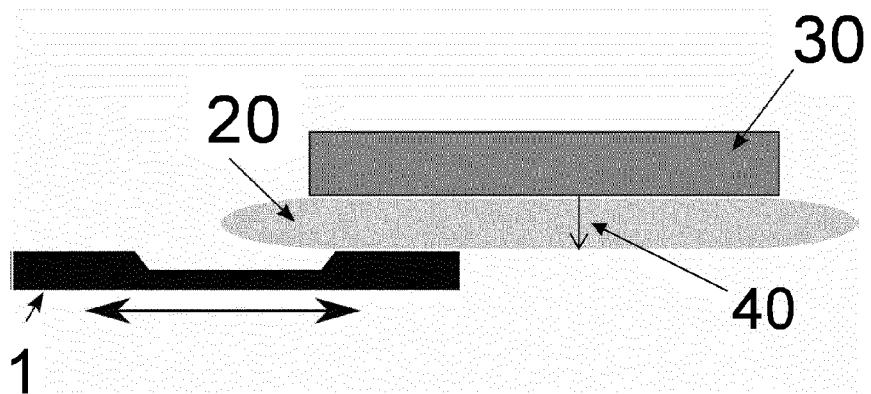
FIG. 6 is a schematic cross section view drawing illustration of an apparatus where substrate illustrated in FIG. 1 is processed in a vacuum chamber sputtering device with the target and the plasma plume or lobe. The main lobe direction is indicated, and is defined as the direction of the resulting vector of all sputtered plasma reaching the surface of the substrate.

FIG. 6 is a simplified cross section view of a vacuum chamber sputtering device where the wafer or chip 1 is moved past the sputtering source 30, in a predefined pattern, and with a direction perpendicular to the main lobe 20 direction 40 during sputtering, and the position of the wafer or chip 1 is positioned and oriented such that a surface normal of the wafer or chip is substantially in parallel with the direction 40 of the main lobe 20 of sputtering.

Figure 7A:
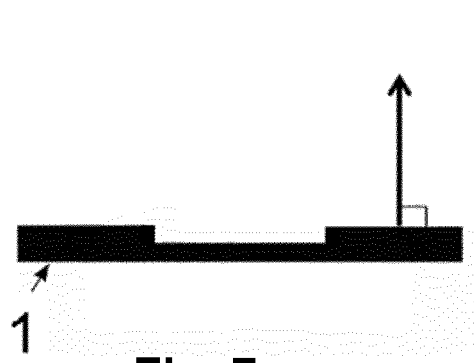
FIG. 7a is a schematic cross section view drawing illustration showing embodiments of the substrate of FIG. 1. The arrow indicates the substrate surface normal disregarding structure details.

FIG. 7a is a simplified cross section view of the wafer or chip 1 where the angle of the sides are 90 degrees relative to the surface of the substrate.

Figure 7B:
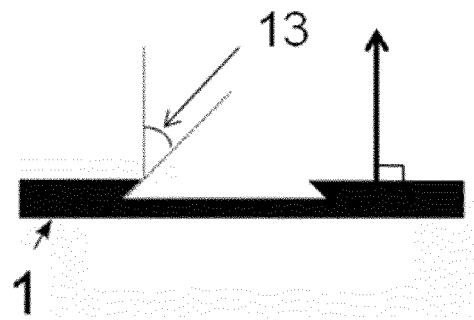
FIG. 7b is a schematic cross section view drawing illustration showing embodiments of the substrate of FIG. 1 with the flanks of the groove being hidden when substrate is viewed from above. The arrow indicates the substrate surface normal disregarding structure details.

FIG. 7b is a simplified cross section view of the wafer chip 1 where the flanks 8 will be hidden/in a shadow relative to the main lobe direction 40 during sputtering if the position of the wafer or chip 1 is positioned and oriented such that the normal of the surface of the substrate is substantially in parallel with the direction 40 of the main lobe 20 of sputtering.

Figure 8:
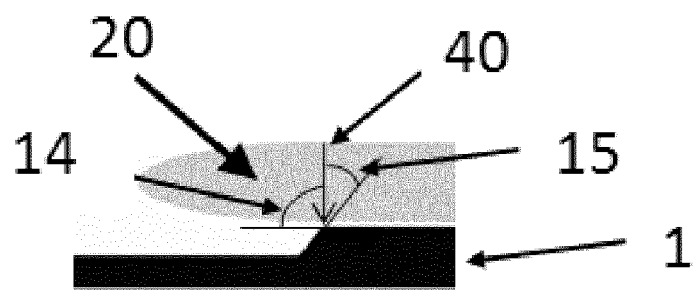
FIG. 8 is a schematic cross section view drawing illustration showing the main direction of the plasma plume or lobe and the angle between the main direction of the plasma plume and the surface of the substrate and the face of the flank respectively.

With reference to the cross section view of FIG. 8 it is shown that the first angle 14 between the surface of the substrate and the main lobe direction 40 and the second angle 15 between the flank 8 and the main lobe direction 40 governs the amount of metal deposited on the different faces. Experiments has shown that using a target 30 formed as a plate of aluminium and choosing a first angle 14 being 90 degrees and a second angle 15 being 35.3 degrees result in building a metal deposition on the elevated region 2 and the lowered region 3 of double thickness than on the flank 8. Different characteristics of target and vacuum chamber may influence the main lobe direction 40 and the resulting thickness of the deposited metal layer on the different faces of the substrate.

Experiments also reveal that using a first angle 14 between the surface of the substrate and the main lobe direction 40 of 90 degrees and the second angle 15 between the flank 8 and the main lobe direction 40 of 35.3 degrees results after sputtering in a metal deposition of approximately $1 \times 10^{-6}$ meter on the flank 8, and a metal deposition of approximately $2 \times 10^{-6}$ meter on the elevated region 2 and the lowered region 3. The following etching process results in a "clean" surface on the flank 8, and an approximately $1 \times 10^{-6}$ meter thick deposited layer on the elevated region 2 and the lowered region 3.

The effect of a thicker deposited layer on the elevated region 2 and the lovered region 3 is also achieved when the normal to the surface of the substrate is not in parallel with the main lobe direction and when the angle between the main lobe direction 40 and the surface of the substrate 14 is at least a minimum angle of more than 0 degrees, and more preferably a minimum angle of more than 30 degrees, more than the angle between the main lobe direction 40 and the side face 15.

Figure 11:
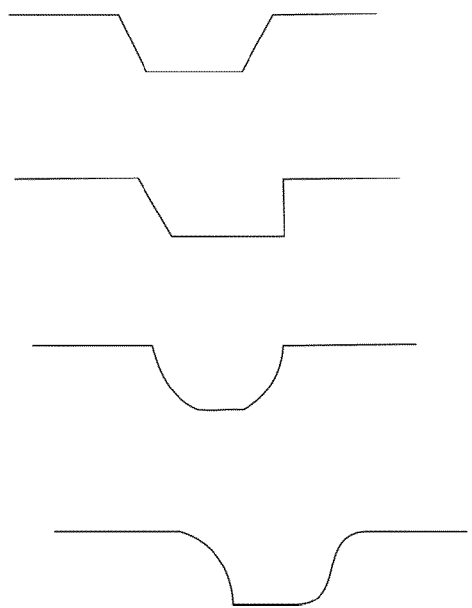
FIG. 11 is a schematic cross section view drawing illustrating more possible shapes of groove.

With reference to FIGS. 10 and 11 it shows that the groove does not have to be symmetrical, nor in principle does it have to have a flat bottom.

The thickness of the deposited layer on the lowered region 7 and on the flanks 8 depends on the form of the groove and on the shadow effect the form of the groove give with respect to the main lobe direction.

Although best results have been obtained with a programmed predefined pattern movement of the substrate past the target, a pattern including a certain amount of randomized movement of the substrate past the target is also part of this invention.

The vacuum chamber operation involves controlling various process parameters, and may include controlling the speed and pattern of movement of the substrate past the target, setting the plasma energy of the sputtering plume, controlling the type of gasses and the pressure of these, setting the distance between the target and the substrate, temperature, pre-heat time and stabilizing times.

From a production perspective it is of great importance to avoid the batch nature of conventional sputtering processes to increase production efficiency.

The sputtering equipment may contain one or more targets of a selected material in a vacuum chamber. During deposition of the selected material, a sample-carrying carrier may oscillate in front of said one or more targets in the vacuum chamber or the sample-carrying carrier may travel past said one or more targets in the vacuum chamber. In one aspect related to the above-mentioned predefined pattern according to the present invention, the sample-carrying carrier may travel from a starting point in one end of the vacuum chamber to an end point in a different end of the vacuum chamber during deposition of the selected material. One or more sample-carrying carriers may be present in the vacuum chamber during deposition. The sample-carrying carriers or samples may enter and exit the vacuum chamber through a vacuum load-lock to ensure in-line processing.

Example of experimental data:
Target: e.g. aluminum (or other desired electrically conductive material, e.g. the ones mentioned in the application)
DC magnetron sputter with moving carrier, e.g. from Leybold Optics.

Number of targets e.g. 8, depending inter alia on the desired thickness of the selected material (typically in the range 1 to 20 μm).

Distance between targets: e.g. 1 meter, depending inter alia on the distance between the targets and the sample and the speed of the sample carrier (typically in the range 0.2 to 2 meters).

Sputtering gas: e.g. argon (or some other noble gas)

Sputtering gas flow: e.g. 200 sccm (typically in the range 100-300 sccm, not important)

Sputtering gas plasma pressure: e.g. 3 e-3 mbar. (typically in the range 1e-3 to 5e-3 mbar)

Moving carrier speed: e.g. 0.3 meters/minute (typically in the range 0.1 to 3 meters/minute).

The choice of process parameters depends on the desired material quality.

Advantages and applications of the invention.

Simplicity and accuracy are significant advantages of the invention. Using only two process steps, herein referred to as sputtering and etching, contacting of conductive parts of a semiconductor wafer or chip that has a multi level surface structure, advantageously for backside metallization and contacting of a BC-BJ silicon solar cell, is obtained without use of traditional and costly masking techniques. The process is robust, reproducible, and compatible with large-scale production of back-contacted silicon solar cells.

The invention claimed is:

1. A method for producing a surface layer of a material in a pattern on a surface of a substrate having a multi level surface structure including at least one of a ridge and a recess, and sloping surface part located adjacently to a top face of said ridge and a bottom face of said recess, the method comprising:

providing the substrate having a groove arranged in said substrate surface, said groove having a bottom face and at least one side face sloping by less than 180 degrees with respect to the substrate top face;

depositing said surface layer on a part of said substrate comprising said groove by vacuum chamber sputtering of said material from a sputtering source while moving said substrate in a pattern past said sputtering source in a direction perpendicular to a direction of a main lobe of sputtering from said sputtering source and with a normal to the substrate surface in an angle with said main lobe direction; and uniformly etching away surface layer material deposited on said substrate by said sputtering until at least a substantial part of said side face is free of said surface layer;

whereby the pattern becomes defined by said material on the bottom face of the groove.

2. The method of claim 1, wherein the substrate is a silicon wafer or chip.

3. The method of claim 1, wherein the material is an electrically conductive material.

4. The method of claim 3, wherein the electrically conductive material includes at least one of aluminium, chromium, copper, gold, iron, lead, molybdenum, nickel, silver, tantalum, tin, titanium, palladium, platinum, and vanadium.

5. The method of claim 1, wherein the sputtering source comprises at least one of aluminium, chromium, copper, gold, iron, lead, molybdenum, nickel, silver, tantalum, tin, titanium, palladium, platinum, and vanadium.

6. The method of claim 1, wherein the normal to the surface of the substrate is in parallel with the direction of said main lobe.

7. The method of claim 1, wherein at least one side face is hidden with respect to the direction of said main lobe.

8. The method of claim 1, wherein the normal to the surface of the substrate is not in parallel with the main lobe direction and where the angle between the main lobe direction and the surface of the substrate is at least 30 degrees more than the angle between the main lobe direction and the side face.

9. The method of claim 1, wherein at least one side face is sloping by less than 165 degrees with respect to said top face.

10. The method of claim 1, wherein at least one side face is sloping by less than 150 degrees with respect to said top face.

11. The method of claim 1, wherein at least one side face is sloping by 125.3 degrees with respect to said top face.

* * * * *